US012702073B2

(12) United States Patent
Khasgiwala et al.

(10) Patent No.: US 12,702,073 B2
(45) Date of Patent: Aug. 4, 2026

(54) POWER ARCHITECTURE WITH DUAL CORE ADVANCE SUBSTRATE

(71) Applicant: Applied Materials, Inc., Santa Clara, CA (US)

(72) Inventors: Mudit Sunilkumar Khasgiwala, Milpitas, CA (US); Subramani Kengeri, Saratoga, CA (US); Meghna Maheshkumar Patel, Navsari (IN); Tameesh Suri, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 231 days.

(21) Appl. No.: 18/526,653

(22) Filed: Dec. 1, 2023

(65) Prior Publication Data

US 2025/0183240 A1     Jun. 5, 2025

(51) Int. Cl.
H05K 1/18          (2026.01)
H05K 1/185         (2026.01)
(Continued)

(52) U.S. Cl.
CPC ............ H10W 90/00 (2026.01); H05K 1/185 (2013.01); H10W 44/20 (2026.01);
(Continued)

(58) Field of Classification Search
CPC ........ H05K 1/115; H05K 1/116; H05K 1/185; H05K 2201/10015; H05K 2201/10378;
(Continued)

(56) References Cited

U.S. PATENT DOCUMENTS 6,346,743 B1 *   2/2002   Figueroa ............... H01L 23/642
                                                361/306.3
9,331,014 B1 *   5/2016   Liu .......................... H10D 1/68
                        (Continued)

FOREIGN PATENT DOCUMENTS

JP          2016025103 A      2/2016
KR        20060041455 A      5/2006
TW          202147550 A     12/2021

OTHER PUBLICATIONS

International Application No. PCT/US2024/057644, International Search Report and Written Opinion mailed on Mar. 14, 2025, 10 pages.

(Continued)

*Primary Examiner* — Roshn K Varghese
(74) *Attorney, Agent, or Firm* — Kilpatrick Townsend & Stockton LLP

(57) ABSTRACT

An electronic device may include a printed circuit board. The electronic device may include a first core with a first cavity, the first core formed from an organic material, and the first cavity configured to house a DC capacitor for delivery of direct current to a die from a voltage source. The device may include a second core with a second cavity, the second core formed from an inorganic material and the second cavity configured to house an AC capacitor coupled to an output of the die for decoupling alternating current effects associated with the direct current. The device may include an interposer layer disposed between the first core and the second core, configured to isolate the first core and the second core.

20 Claims, 4 Drawing Sheets

(51) Int. Cl.

| | |
|---|---|
| H10W 44/20 | (2026.01) |
| H10W 70/63 | (2026.01) |
| H10W 90/00 | (2026.01) |
| *H10W 70/695* | (2026.01) |
| *H10W 70/698* | (2026.01) |

(52) U.S. Cl.
CPC ....... *H10W 70/635* (2026.01); *H10W 90/401* (2026.01); *H10W 44/212* (2026.01); *H10W 44/243* (2026.01); *H10W 70/695* (2026.01); *H10W 70/698* (2026.01); *H10W 90/724* (2026.01)

(58) Field of Classification Search
CPC ......... H01L 23/49827; H01L 23/49833; H01L 23/66; H01L 23/145; H01L 23/147; H01L 23/16; H01L 23/49822; H01L 23/50; H01L 2223/6622; H01L 2223/6666; H01L 2224/16225
See application file for complete search history.

(56) References Cited

U.S. PATENT DOCUMENTS

| | | | | |
|---|---|---|---|---|
| 9,538,645 | B2 * | 1/2017 | Kobuke | ............... H05K 1/0306 |
| 2006/0157826 | A1 * | 7/2006 | Lee | ...................... H05K 3/4641 |
| | | | | 257/635 |
| 2009/0079065 | A1 | 3/2009 | Furgut et al. | |
| 2014/0262440 | A1 * | 9/2014 | Kim | ......................... H05K 1/02 |
| | | | | 174/250 |
| 2016/0343685 | A1 | 11/2016 | Lin et al. | |
| 2020/0005999 | A1 * | 1/2020 | Masuda | ................... H05K 1/18 |
| 2020/0203337 | A1 | 6/2020 | Zhang et al. | |

OTHER PUBLICATIONS

Taiwanese Application No. 113146307, Office Action mailed on Aug. 5, 2025, 4 pages (1 page of English Translation and 3 pages of original documents).

* cited by examiner

POWER ARCHITECTURE WITH DUAL CORE ADVANCE SUBSTRATE

TECHNICAL FIELD

The present technology relates to semiconductor systems, processes, and equipment. More specifically, the present technology relates to power delivery networks of advanced packages.

BACKGROUND

As electronic devices are miniaturized and performance increased, the efficient delivery of power to the electronic devices becomes more crucial. In applications such as high-performance computing (HPC), the power needs of an electronic device may fluctuate rapidly. This rapid fluctuation of current within a package may generate unwanted effects such as electromagnetic interference, alternating current ripple, and other such effects. Routing vias to carry signals to minimize these effects may cause other problems, such as voltage drop due to the length of a via, thermosmechanical weaknesses, and other problems. Thus, there is a need to efficiently deliver power to an electronic device within a package, while reducing negative effects.

BRIEF SUMMARY

A device may include a printed circuit board. The device may include a first core disposed on the printed circuit board and include a first cavity. The device may include a second core disposed on the first core and include a second cavity. The device may include a first electronic device disposed within the first cavity, where the first electronic device is configured to provide a direct current to a die. The device may include a second electronic device disposed within the second cavity, the second electronic device configured to decouple alternating current effects from the direct current.

In some embodiments, the first electronic device may include an integrated passive device. The integrated passive device may include a deep trench capacitor or an inductor. The second electronic device may include an integrated passive device. The integrated passive device may include a capacitor. The first core may include a direct current domain for providing direct current to the die. The second core may include an alternating current domain for providing an alternating current to the die. An integrated voltage regulator may provide a current to the die, where the first electronic device within the first core modulates the current provided to the die.

An electronic device may include a printed circuit board. The electronic device may include a first core with a first cavity, the first core formed from an organic material, and the first cavity configured to house a DC capacitor for delivery of direct current to a die from a voltage source. The device may include a second core with a second cavity, the second core formed from an inorganic material and the second cavity configured to house an AC capacitor coupled to an output of the die for decoupling alternating current effects associated with the direct current. The device may include an interposer layer disposed between the first core and the second core, configured to isolate the first core and the second core.

In some embodiments, the inorganic material may include at least one of glass and silicon. The organic material and the inorganic material may be selected based at least in part on a coefficient of thermal expansion (CTE) associated with each of the organic material and the inorganic material. The DC capacitor and the AC capacitor are embedded within a through substrate via (TSV), the TSV extending through the first core and the second core.

An electronic device may include a voltage source for providing direct current power to a die. The electronic device may include a first core with a first capacitor, the first capacitor configured to deliver the direct current power to the die, the first core configured to isolate a DC domain of the electronic device. The electronic device may include a second core with a second capacitor, the second capacitor configured to decouple alternating current interference from an output of a die, the second core configured to isolate an AC domain of the electronic device.

In some embodiments, the second core may include four layers of at least one of glass and silicon. The first core may include between about 12 and about 16 layers of organic material. A location of the die and a location of the voltage source may be based at least in part on a voltage drop versus an alternating current frequency response, such that a power delivery network is optimized. The second capacitor may include a tunable capacitor, configured to be adjusted to alter a frequency response of the electronic device. The electronic device may include a through substrate via (TSV), and the TSV may include a switching inductor.

DETAILED DESCRIPTION

Figure 1:
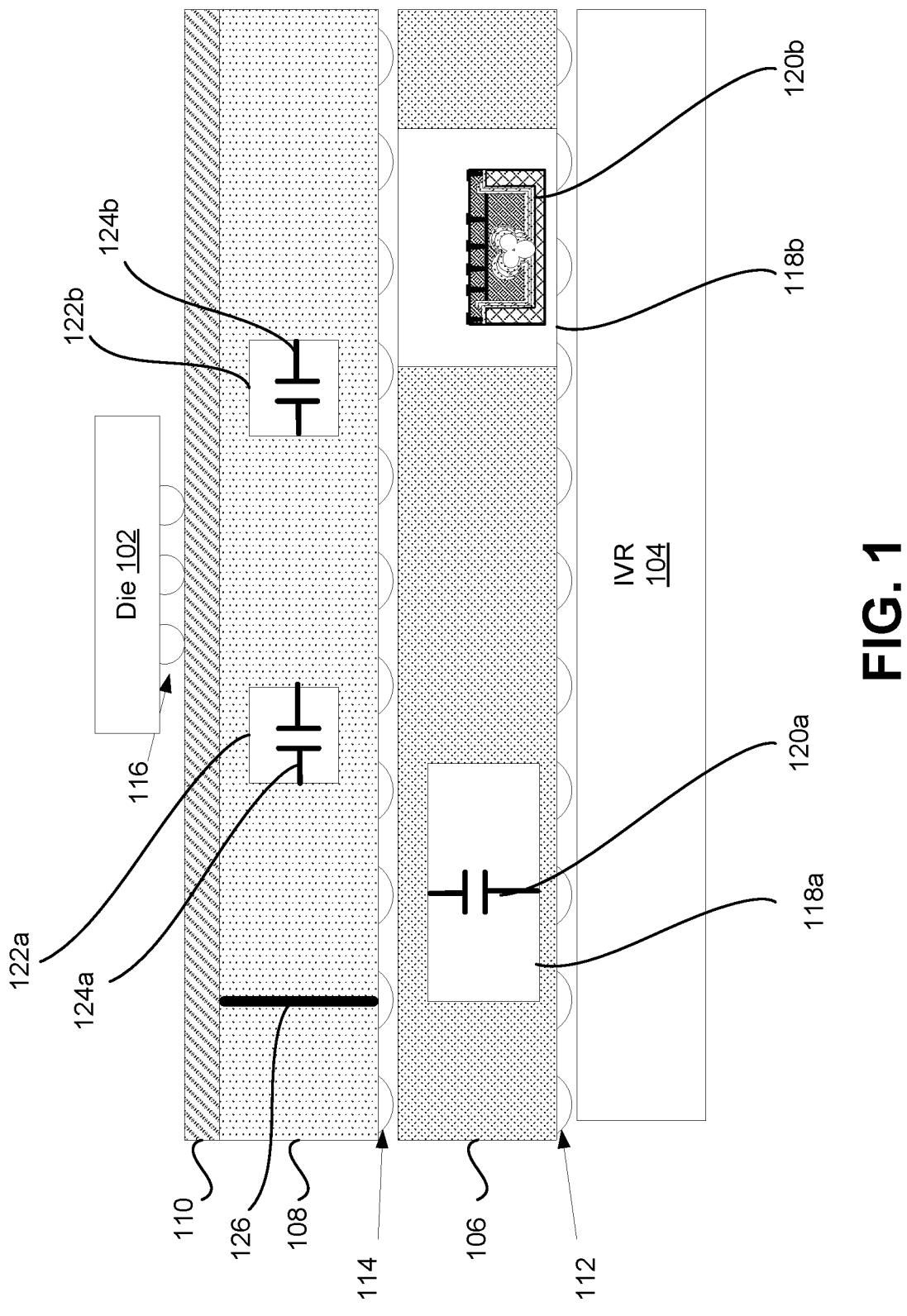
FIG. 1 illustrates a package with a dual core hybrid architecture, according to certain embodiments.

Modern electronic systems may include a diverse power delivery network (PDN) to provide power to one or more devices, dies, etc. (sometimes "loads"). A PDN may include a system level implementation package and/or a printed circuit board (PCB) level for voltage regulators (VR) and/or integrated voltage regulators (IVRs), inductors, alternating current (AC) decoupling capacitors, direct current (DC) charging capacitors, and other components of a PDN. However, an architecture of a PDN with the above components may pose challenges at an advanced package level, and may lead to engineering tradeoffs between power, performance, thermal, space/size, cost, and other concerns. Some challenges in PDN design may optimizing power routes and system resistances for lower static current-resistance (IR) drop, dynamic current over time operations (di/dt; Slew rate), low/mid/high frequency decoupling for optimal AC ripple and/or electromagnetic interference (EMI) performance, system efficiency by lowering power requirements of voltage regulators, inductors, and other components.

Next-generation process nodes may continue to reduce a threshold voltage for high-performance complementary metal-oxide-semiconductor (CMOS) transistors in order to reduce dynamic power consumption in device such as system-on-a chip (SoC) devices and platforms. However, this may lead to a significant reduction in absolute operating voltage margins for CMOS operation, which may further exacerbate the challenges of power delivery subsystem in next-gen SoCs-both, for static (IR losses) and dynamic (di/dt) operations.

A next-gen SoCs may utilize a steady supply voltage to run at higher frequencies and to support fine-grain power management techniques (e.g., DVFS, SoC sleep and power states, etc.). These features may also demand rapidly changing current consumption over a small-time scale. Because a PDN subsystem of the next-gen SoC may have substantial parasitic inductance, the higher frequency current variation may produce voltage ripple on the chip's supply lines, interfering with the steady supply voltage needed by the next-gen SoC. If the supply voltage rises or drops below outside range, the next-gen SoC (or other devices) may malfunction.

Efficient power delivery for such devices may require a distributed network of decoupling capacitors (AC capacitors), as close as possible to the PDN and/or ground networks within a package. Contemporary architectures may distribute these AC capacitors on the PCB (on-board capacitors), and/or on the bottom of the package (land-side capacitors). In some cases, AC capacitors can be placed/embedded in organic substrates to be as close as possible to PDN/ground networks. However, embedded capacitors in traditional high-performance computing substrates (with 16-20+ layers) can still have larger distances between capacitors and on-die bumps (more than 300-500 um+).

One solution to these issues may be a wafer-on-wafer solution with a deep-trench capacitor (DTC) bonded to a logic wafer. This solution may place AC capacitors (i.e., the DTC) close to the die's (e.g., an SoC, CPU, etc.) PDN/ground network. This solution, however, may be cost prohibitive and may require pre-designing dies and DTC wafers in co-operation.

Another solution may be a dual-core hybrid packaging structure (sometimes "package"). The package may include a PCB, and organic core, and a glass core (or interposer). The glass core and the organic core may each include one or more cavities, with capacitors disposed within. The DC capacitors (e.g., charging capacitors) may be disposed within the organic core, and the AC capacitors (e.g., decoupling capacitors) may be disposed within the glass core. The glass core may include 4 layers and the organic core may include 16 layers, allowing high-density, fine pitch-scaled designs (e.g., for high-performance computing (HPC) applications). Also, because the AC capacitors and DC capacitors are disposed within separate cores, the AC and DC domains are separated. This may allow the AC capacitors to be as close to a load (e.g., a SoC, CPU, or other device) and the DC capacitors to be as close to the source (e.g., an VR/IVR) without intermingling the AC and DC domains. By separating the AC and DC domains, greater control over properties such as slew rate while providing a steady supply voltage to the load.

FIG. 1 illustrates a package 100 with a dual core hybrid architecture, according to certain embodiments. The package 100 may include a die 102, an IVR 104, a first core 106, a second core 108, and a redistribution layer (RDL) 110. The die 102 may include an SoC, a CPU, a graphics processing unit (GPU), or any other such electronic device. The IVR 104 may include any suitable voltage source to supply power to the die 102. The first core 106 may be electrically connected to the IVR 104 via first contacts 112. A pitch of the first contacts 112 may be within a range of about 200 micrometers to about 600 micrometers, inclusive. The second core 108 and the first core 106 may be electrically connected via second contacts 114. A pitch of the second contacts may be within a range of about 80 micrometers to about 150 micrometers, inclusive. The die may be electrically connected to the RDL 110 and/or the second core 108 via third contacts 116. A pitch of the third contacts may be within a range of about 20 micrometers to about 50 micrometers, inclusive.

The first core 106 may include cavities 118a-b. Capacitors 120a-b may be disposed within the cavities 118a-b. The capacitors 120a-b may be DC capacitors, configured to provide a steady voltage from the IVR 104 to the die 102 (e.g., charging capacitors). As shown in FIG. 1, the capacitor 120a may be a bulk capacitor. The capacitor 120b may be a Bryce capacitor manufactured through a microassembly process and including fused particles within a cavity within the capacitor 120b. Although only two cavities 118a-b are shown, any number of cavities may be present within the first core 106. The capacitors 120a-n may be of the same type (e.g., bulk capacitors, Bryce capacitors, deep trench capacitors (DTC), etc.) of may include any number of different types of capacitors. The first core 106 may include all or substantially all of the DC capacitors associated with delivery of power from the IVR 104 to the die 102 of the package 100. In other words, the first core 106 and associated components (e.g., the capacitors 120a-b) may make up the DC power management unit (PMU) of the package 100.

The first core 106 may include a number of layers of organic material. For example, the first core may include about 12 layers, about 13 layers, about 14 layers, about 15 layers, or about 16 layers. Thus, the first core 106 may be symmetric or asymmetric, including an equal or unequal number of layers above and below the cavities 118a-b. The organic material may include pentacene, anthracene, and other organic semiconducting materials.

The second core 108 may be an interposer (or an "interposer layer"), separating the first core 106 from other components of the package 100. In some embodiments, and interposer later may be disposed between the first core 106 and the second core 108. The second core 108 may include a number of layers of an inorganic material such as glass and/or silicon. In some embodiments, the second core 108 may be manufactured from one material (e.g., glass). In other embodiments, the second core 108 may be manufactured from multiple materials (e.g., glass and silicon). The second core 108 may include 2 layers, 3 layers, 4 layers, or more (e.g., within a range of about 5 layers to about 20 layers). The second core 108 may include a total thickness in a range of about 100 micrometers to about 1000 micrometers, inclusive.

The second core 108 may include cavities 122a-b. Capacitors 124a-b may be disposed within the cavities 122a-b. As shown in FIG. 1, the capacitors 124a-b may be bulk capacitors. However, one or both of the capacitors 124a-b may be another type of capacitor, such as a Bryce capacitor manufactured through a microassembly process and including fused particles. The capacitors 124a-b may be configured to decouple any frequency ripple, slew rate, EMI, and/or any other unwanted effects due to the power delivery from the IVR 104 to the die 102 (e.g., from an output of the die 102). The capacitors 124a-b may be AC capacitors, and the decoupling may allow for rapid changes in power delivery from the DC domain (e.g., the first core 106 and IVR 104) to the die 102. The capacitors 124a-b may include tunable capacitors. The tunable capacitors may allow for the package to be tuned to mitigate effects from an AC frequency response. Thus, if the die 102 is a device that requires rapidly changing power needs, the IVR 104 may respond accordingly, and the unwanted effects may be reduced because of the AC capacitors.

The second core 108 may also include a via 126. Although only one via 126 is shown, it should be understood that there may be any number of vias included in the second core 108. The via 126 may provide DC power from the DC domain (e.g., the first core 106) to the die 102 via the RDL 110. The via 126 may be a through substrate via (TSV) and/or a through glass via (TGV). In some embodiments, one or more capacitors may be integrated in the via 126 (as described below). For example, a metal-insulator-metal (MIM) capacitor may be integrated along the via 126 and configured to decouple the die 102 from unwanted effects from a changing DC within the via 126.

Because the AC domain (i.e., the second core 108 and associated components) and the DC domain (i.e., the first core 106 and the associated components) are separated, the pitch of the third contacts 116 may be fine. Because the unwanted AC effects have been decoupled from the power (or "signals") being transmitted through the third contacts 116 the third contacts may be finely pitched at a high density to allow HPC interconnections and enable efficient routing of all signals received by and transmitted by the die 102.

Although the IVR 104 is shown at the bottom of the package 100 and the die 102 disposed at the top of the package 100, other arrangements may be possible. For example, the IVR 104 may be embedded within the first core 106 and the die 102 may be embedded with the second core 108. In another example, the second core 108 and the die 102 may be on the bottom of the package, and the IVR 104 and the first core 106 on the top. In other words, separating the AC and DC domains may allow any configuration of the package. Because of this flexibility, a package may be designed to minimize IR drop vs AC frequency response and/or other undesired effects. Furthermore, the materials used to form the first core 106 and the second core 108 may be selected in part on a difference in a coefficient of thermal expansion associated with each of the materials.

Figures 2A, 2B:
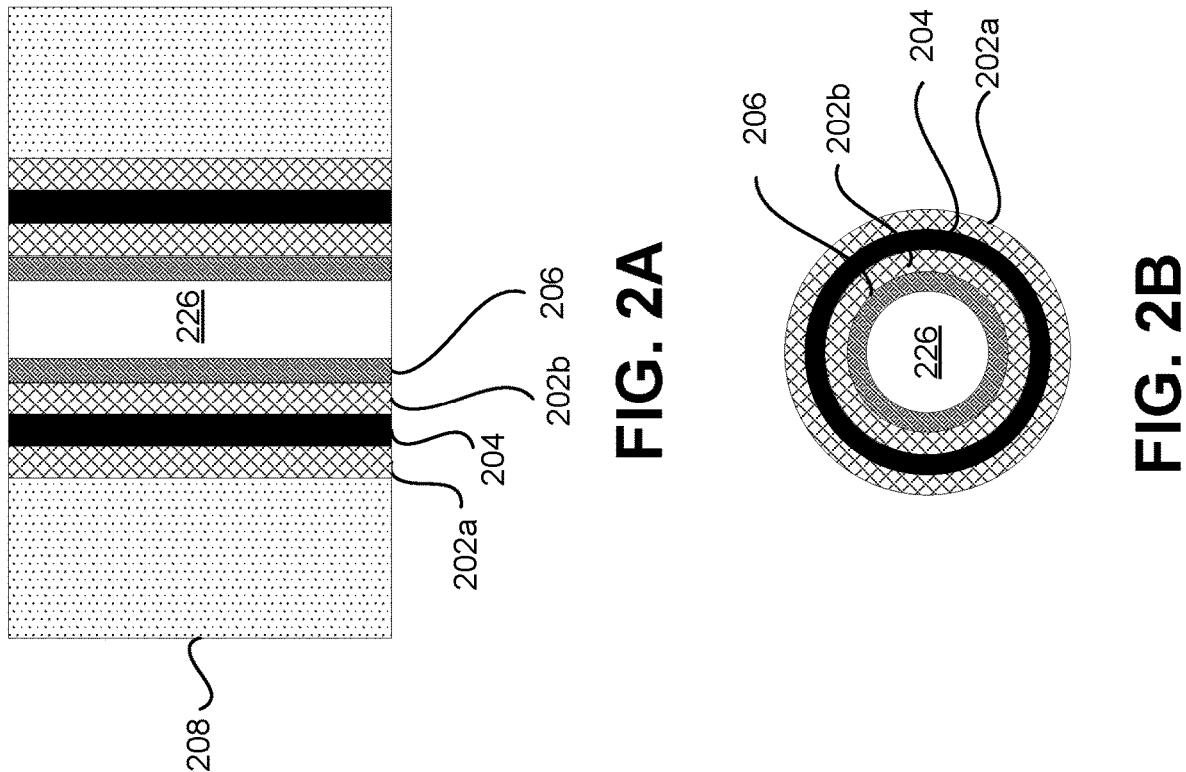
FIG. 2A illustrates a cutaway view of a through substrate via, according to some embodiments.
FIG. 2B illustrates a top-down view of a through substrate via, according to some embodiments.

FIG. 2A illustrates a cutaway view of a through substrate via (TSV) 226, according to some embodiments. FIG. 2B illustrates a top-down view of the TSV 226, according to some embodiments. The TSV 226 may be similar to the via 126 in FIG. 1. As such, the TSV 226 may extend through a core 208 of a package, the core 208 formed from a material such as glass and/or silicon. The core 208 may be one component of the package, and configured to house the AC domain of the package—that is, to decouple any unwanted effects from the changing DC power requirements of a device (e.g., the rapid switching of power needs associated with HPC devices). The TSV 226 may be implemented in the core 208 in addition to or as an alternative to other capacitors disposed in the core 208 (e.g., bulk capacitors, Bryce capacitors, etc.).

The TSV 226 may be configured to deliver a DC signal from a VR/IVR to a load, such as the die 102 in FIG. 1. To do so, the TSV 226 may include a metal such as copper for transmitting the DC signal to the load. The TSV 226 may include a thickness within a range of about 75 micron to about 700 micron, inclusive. As shown in FIGS. 2A and 2B, the TSV 226 may also include an AC capacitor as an integrated passive device (IPD) and/or a switching inductor. In other words, the TSV 226 may include an AC capacitor integrated into the TSV 226 without necessarily being powered separately. To integrate the IPD AC capacitor, the TSV 226 may include a first metal layer 202a. The first metal layer 202a may include titanium nitrite, copper, iron, cobalt, or any other suitable metal. The first metal layer 202a may be electrically connected to a ground network of the package. Additionally or alternatively, the first metal layer 202a may be isolated from the core 208 by an insulating layer (not shown).

The TSV 226 may also include a dielectric layer 204. The dielectric layer 204 may include aluminum, zirconia, a ceramic, or other suitable insulating material. The dielectric layer 204 may include a material with a high dielectric constant (high-k material). The TSV 226 may also include a second metal layer 202b. The second metal layer 202b may include the same or different materials as the first metal layer 202a. For example, the second metal layer 202b may include titanium nitrite, copper, iron, cobalt, or any other suitable metal. The TSV 226 may also include an insulating layer 206. The insulating layer 206 may include materials such as Glass, Silicon, dielectrics such as Ajinomoto build-up film, and/or other such dielectrics.

As described above, a load in advanced package may require varying DC power levels during operation. As the DC power level requirements change, an VR/IVR may output the various DC power levels via a DC domain (e.g., the first core 106 and associated components in FIG. 1). Consequently, the DC signal passing through the TSV 226 may change over time. The changing of the DC signal over time may interfere with the performance of the load by emitting EMI, parasitic inductance, or other unwanted effects to an output of the load, other components of the package, other vias, and/or other such structures. The first metal layer 202a, the dielectric layer 204, and the second metal layer 202b therefore form a MIM capacitor and decouple the DC signal from any unwanted effects due to a change in the DC signal. Because the TSV 226 may include an integrated MIM, the core 208 (and therefore the package) may include higher capacitive density than standalone TSVs and capacitors, while still isolating the DC domain and the AC domain.

Figure 2C:
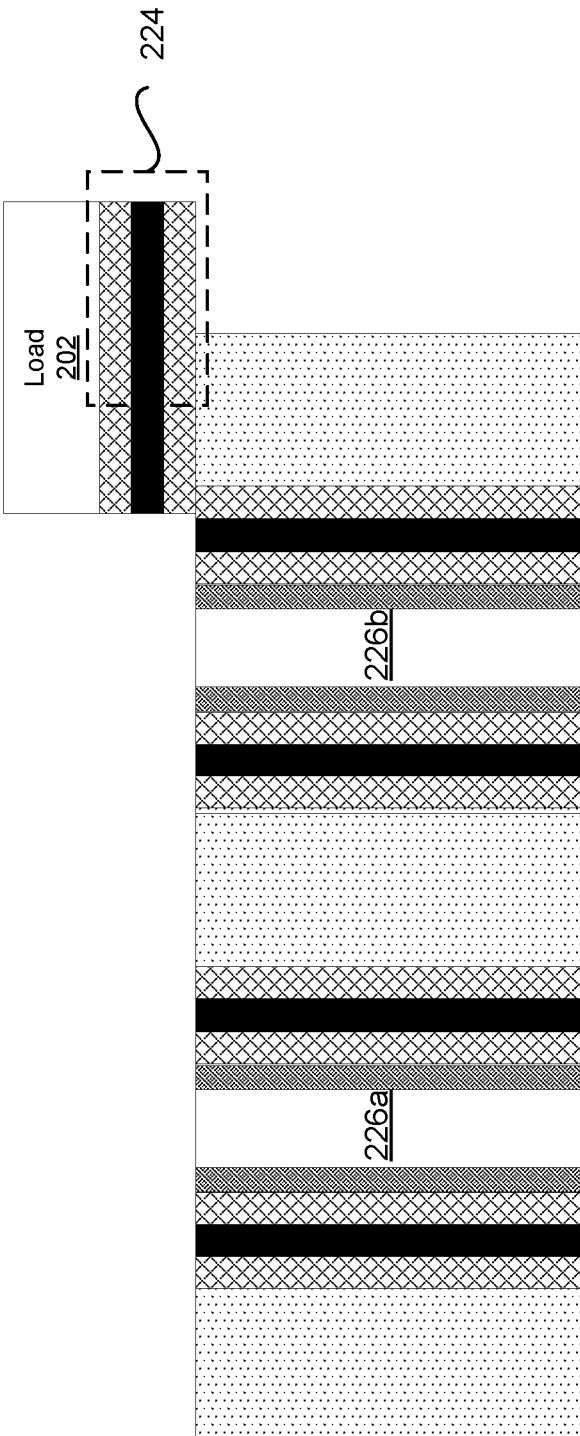
FIG. 2C illustrates a core with two through substrate vias and a capacitor, according to some embodiments.
Figure 2C:

FIG. 2C illustrates the core 208 with two TSVs 226a-b and a MIM capacitor 224, according to some embodiments. Instead of the one TSV 226 described in FIGS. 2A and 2B, the core 208 may include multiple TSVs. Each of the TSVs 226a-b may include integrated MIM capacitors, including first metal layers 202a, dielectric layers 204, second metal layers 202b, etc. FIG. 2C also illustrates a load 202, disposed on the core 208. To further isolate the load 202 from any unwanted effects from the DC signal, the MIM capacitor 224 may be disposed near the load 202 (e.g., near an output of the load 202). For example, the DC currents flowing through the TSVs 226a-b may be implemented with switching inductors. Thus, the MIM capacitor 224 may be integrated into the package to decouple the load 202 from the inductance generated by the TSVs 226a-b.

The MIM capacitor 224 may be similar to the integrated MIM capacitors within the TSVs 226a-b and include similar layers formed of similar materials. The MIM capacitor 224 may alternatively be formed of different materials. In some embodiments, the MIM capacitor 224 may be some other type of capacitor, such as a bulk capacitor, a Bryce capacitor, a tunable capacitor, etc.

It should be understood that any of the embodiments described herein may be combined with any other embodiments. For example, a TSV with an integrated MIM capacitor as shown in FIGS. 2A-2C may be disposed in a core including cavities with other capacitors, as is shown in FIG. 1. Furthermore, it should be understood that the placement of some or all of the components shown in any of the Figures may be disposed in a different arrangement than is shown.

Figure 3:
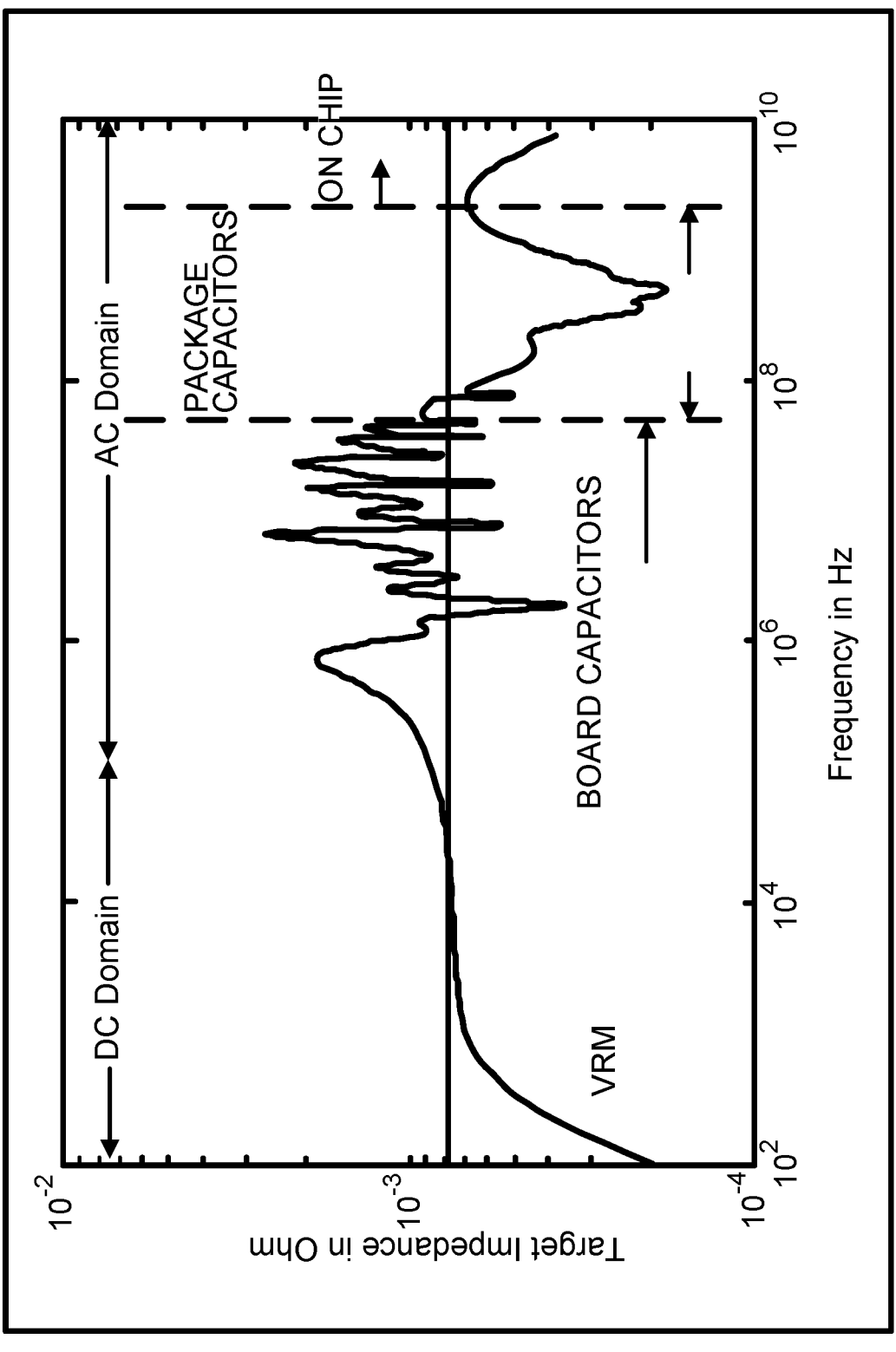
FIG. 3 illustrates a graph of impedance within a package over various AC frequencies as mitigated by various capacitors, according to certain embodiments.

FIG. 3 illustrates a graph 300 of impedance within a package over various AC frequencies as mitigated by various capacitors, according to certain embodiments. The horizontal axis of the graph 300 represents the frequency in Hz of AC frequencies (e.g., generated by varying DC power levels in a package such as the package 100 in FIG. 1). The vertical axis of the graph 300 represents the impedance in vias of the package generated due to the AC frequencies (e.g., the AC frequencies may raise the impedance of various components within the package). The graph 300 will be described in relation to Table 1, below.

TABLE 1

| Domain | Capacitance Range | Affected Frequency Range | Capacitor Type |
|---|---|---|---|
| DC Domain (low frequency) | >1 μF | <100 KHz | Bulk Decoupling Cap. |
| AC/Mid Frequency | 1 μF–1 nF | 100 KHz–100 MHz | Embedded Thin-Film Cap. |
| AC/High Frequency | 1 nF–1 pF | 100 MHz–1 Ghz | On-Package Cap. |
| AC/Very High Frequncy | 1 pF–100 pF | >1 GHz | On-Chip Cap. |

Capacitive reactance is inversely proportional to the frequency of an AC current. Thus, in order to decouple AC frequencies from a via (or other component) within a package, a variety of capacitors types and locations (in relation to a load, ground, line, etc.) may be used. According to some embodiments, AC frequencies of less than or about 100 KHz may be decoupled using capacitors in or around the microfarad range. As seen on the graph 300, AC frequencies of about 1 KHz to about 100 KHz fall into the DC domain. Even though there may be variation in current (giving rise to the 1 Khz to 100 KHz frequency range), the frequencies are low enough to be treated as a direct current. To decouple noise generated at this frequency range, bulk decoupling capacitors may be used. For example, the bulk decoupling capacitors may be disposed in a cavity of a core or substrate, such as the first core 106 in FIG. 1. Additionally or alternatively, the bulk decoupling capacitors may be disposed on a PCB. In either case, the capacitors used for decoupling the DC domain may be disposed relatively near a voltage source (e.g., the IVR 104 in FIG. 1).

As the AC frequency increases, the capacitors needed to decouple the AC frequency decreases. As shown on the graph 300, the AC domain may begin at a frequency range of about 100 KHz. The impedance of vias within the package also increases yet may be mitigated by other capacitors of other types. For example, at about 100 KHz, the impedance experienced by the package increases. The oscillations in the line shown in the graph 300 may represent various capacitors with respective capacitance, decoupling the signal to keep the impedance at or near a target impedance. For example, as shown in Table 1, capacitors with a capacitance range of about 1 μF to about 1 nF may be used to decouple the AC frequency within a range of about 100 KHz to about 100 MHz. These capacitors may include embedded thin film capacitors such as deep trench capacitors and/or thin film MIM capacitors embedded along a via (e.g., the TSV 226 in FIGS. 2A-C). These capacitors may additionally or alternatively be disposed on the PCB or elsewhere on a second core of the package (e.g., the second core 108). One of ordinary skill in the art would recognize many different possibilities and configurations.

As the AC frequency continues to increase, the capacitance needed to decouple the AC frequencies continues to decrease. The graph 300 shows a drop in impedance at an AC frequency range of about 100 MHz to about 1 Ghz. This drop may be achieved by on-package capacitors in the 1 nF to 1 pF range. The on-package capacitors may be MIM capacitors, Bryce Capacitors, or any other type of suitable capacitors. The on-package capacitors may be similar to the capacitors 124*a-b* in FIG. 1 and be disposed in cavities in an inorganic core. The on-package capacitors may be placed near the load, to maximize the decoupling effects of the on-package capacitors.

For very high frequency AC frequencies, capacitors with an even lower capacitance range may be used. As shown in Table 1, capacitors with a capacitance of about 1 pF to about 100 pF may be used to decouple AC frequencies of about 1 GHz or greater. Furthermore, these capacitors may by on-chip, meaning included on or at the load, For example, the MIM capacitor 224 in FIG. 2C is shown directly at the load 202. Thus, the MIM capacitor 224 may be considered an on-chip capacitor.

Because packages may experience a variety of AC frequencies (as illustrated in the graph 300), a variety of capacitor types and locations thereof may be employed on a single package to decouple the package from the variety of AC frequencies. Furthermore, the AC and DC domains may be separated, allowing for shorter paths from a voltage source to a load, while providing the decoupling necessary to allow for HPC and other applications. For example, a bulk capacitor may be disposed in a cavity in a core. The bulk capacitor may therefore decouple any noise from low frequency AC or DC signals. Thin-film capacitors may be employed along a TSV passing through a second core, decoupling any AC frequencies inadvertently generated by current flowing through the via. Additionally, the second core may include cavities with one or more capacitors housed within to decouple other AC frequencies. Still other capacitors may be disposed at or near the load. Thus, by employing a dual-core architecture and isolating the AC and DC domains, advanced packages may experience greater performance with fewer undesirable effects from unwanted AC signals.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed but could have additional steps not included in a figure. A process may correspond to a method, a function, a procedure, a subroutine, a subprogram, etc. When a process corresponds to a function, its termination can correspond to a return of the function to the calling function or the main function.

What is claimed is:

1. An electronic device, comprising:
a printed circuit board;
a first core disposed on the printed circuit board, the first core being formed from an organic material comprising a first cavity;
a second core disposed on the first core, the second core being formed from an inorganic material comprising a second cavity;
a first electronic device disposed within the first cavity, the first electronic device providing a direct current to a die; and
a second electronic device disposed within the second cavity, the second electronic device decoupling effects from the direct current.

2. The electronic device of claim 1, wherein the first electronic device comprises an integrated passive device.

3. The electronic device of claim 2, wherein the integrated passive device is a deep trench capacitor or an inductor.

4. The electronic device of claim 1, wherein the second electronic device comprises an integrated passive device.

5. The electronic device of claim 4, wherein the integrated passive device is a capacitor.

6. The electronic device of claim 1, wherein the first core comprises a direct current domain for providing direct current to the die.

7. The electronic device of claim 1, wherein the second core comprises an alternating current domain for providing an alternating current to the die.

8. The electronic device of claim 1, wherein an integrated voltage regulator provides a current to the die, wherein the first electronic device within the first core modulates the current provided to the die.

9. The electronic device of claim 1, wherein the first core is configured to house components associated with a DC domain and the second core is configured to house components associated with an AC domain.

10. An electronic device, comprising:
a printed circuit board;
a first core comprising a first cavity, the first core formed from an organic material and the first cavity configured to house a DC capacitor for delivery of direct current to a die from a voltage source;
a second core comprising a second cavity, the second core formed from an inorganic material and the second cavity configured to house an AC capacitor coupled to an output of the die for decoupling alternating current effects associated with the direct current; and
an interposer layer disposed between the first core and the second core, configured to isolate the first core and the second core.

11. The electronic device of claim 10, wherein the inorganic material comprises at least one of glass and silicon.

12. The electronic device of claim 10, wherein the DC capacitor is a Bryce capacitor.

13. The electronic device of claim 10, wherein the organic material and the inorganic material are selected based at least in part on a coefficient of thermal expansion (CTE) associated with each of the organic material and the inorganic material.

14. The electronic device of claim 10, wherein the DC capacitor and the AC capacitor are embedded within a through substrate via (TSV), the TSV extending through the first core and the second core.

15. An electronic device, comprising:
a voltage source for providing direct current power to a die;
a first core formed from an organic material and comprising a first capacitor, the first capacitor delivering the direct current power to the die, and the first core isolating a DC domain of the electronic device; and
a second core formed from an inorganic material and comprising a second capacitor, the second capacitor decoupling alternating current interference from an output of a die, and the second core isolating an AC domain of the electronic device.

16. The electronic device of claim 15, wherein the second core comprises four layers of at least one of glass and silicon.

17. The electronic device of claim 15, wherein first core comprises between about 12 and about 16 layers of organic material.

18. The electronic device of claim 15, wherein a location of the die and a location of the voltage source is based at least in part on a voltage drop versus an alternating current frequency response, such that a power delivery network is optimized.

19. The electronic device of claim 15, wherein the second capacitor comprises a tunable capacitor, configured to be adjusted to alter a frequency response of the electronic device.

20. The electronic device of claim 15, further comprising a through substrate via (TSV), the TSV comprising a switching inductor.

* * * * *